United States Patent
Cipolla et al.

(10) Patent No.: US 6,752,201 B2
(45) Date of Patent: Jun. 22, 2004

(54) COOLING MECHANISM FOR AN ELECTRONIC DEVICE

(75) Inventors: Thomas M Cipolla, Katonah, NY (US); Tarek J Jamal-Eddine, Brewster, NY (US); Lawrence S Mok, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/305,879

(22) Filed: Nov. 27, 2002

(65) Prior Publication Data

US 2004/0099404 A1 May 27, 2004

(51) Int. Cl.[7] .............................................. F28D 15/00
(52) U.S. Cl. .............. 165/121; 165/104.33; 165/104.21
(58) Field of Search ........................... 165/185, 104.26, 165/104.33, 104.21, 121; 361/697, 687, 704, 700

(56) References Cited

U.S. PATENT DOCUMENTS

| | | | |
|---|---|---|---|
| 6,078,499 A | 6/2000 | Mok ........................... 361/687 |
| 6,105,662 A | 8/2000 | Suzuki ................... 165/104.33 |
| 6,111,748 A | 8/2000 | Bhatia ......................... 361/695 |
| 6,122,169 A * | 9/2000 | Liu et al. ..................... 361/700 |
| 6,137,681 A * | 10/2000 | Lu .............................. 361/697 |
| 6,166,906 A * | 12/2000 | Sun et al. .................... 361/697 |
| 6,328,097 B1 * | 12/2001 | Bookhardt et al. ..... 165/104.33 |
| 6,348,748 B1 * | 2/2002 | Yamamoto .................... 310/62 |
| 6,421,239 B1 * | 7/2002 | Huang ......................... 361/696 |
| 6,439,299 B1 * | 8/2002 | Miyahara et al. ............ 165/121 |
| 6,491,298 B1 * | 12/2002 | Criss-Puszkiewicz et al. ....................... 273/148 R |
| 2001/0445271 * | 11/2001 | Li .......................... 165/104.29 |
| 2003/0000684 A1 * | 1/2003 | Huang et al. .......... 165/104.33 |
| 2003/0053296 A1 * | 3/2003 | Tanaka et al. ............... 361/719 |
| 2003/0081382 A1 * | 5/2003 | Lin .............................. 361/697 |
| 2003/0161102 A1 * | 8/2003 | Lee et al. .................... 361/687 |

* cited by examiner

*Primary Examiner*—Terrell McKinnon
(74) *Attorney, Agent, or Firm*—Ohlandt, Greeley, Ruggiero & Perle, L.L.P.; Daniel P. Morris

(57) ABSTRACT

A cooling mechanism having a heat sink, a first conduction device, and a convection device is provided. The first conduction device conducts heat from a heat source to the heat sink. The convection device has a first side, a second side, a peripheral dimension. The heat sink is disposed about the peripheral dimension of the convection device. The convection device draws in air through the first and second sides and forces the air radially outward across the heat sink. A cooling mechanism is also provided wherein the cooling mechanism has a ratio of heat removal in watts to volume in cubic centimeters from about 1:1 to about 3:11 at a sound level of between about 20 and 40 decibels.

20 Claims, 4 Drawing Sheets

COOLING MECHANISM FOR AN ELECTRONIC DEVICE

BACKGROUND OF THE INVENTION

1. Field of the Invention

The present disclosure is related to cooling mechanisms. More particularly, the present disclosure is related to a cooling mechanism for an electronic device.

2. Description of Related Art

The power consumption of electronic devices especially the power consumption of central processing units (CPU) used therein continues to increase. For example, the total power consumption of a present-day laptop computer is typically in a range between 10 to 50 watts. More specifically, the power consumption of the CPU in many present-day laptop computers is in a range of about 2 to 18 watts, with some CPUs consuming up to 40 watts. Most of the power consumed by these electronic devices is dissipated as heat. Removing the heat from such electronic devices can be a critical aspect in maintaining the longevity and functionality of the device. Accordingly, the need for improved cooling mechanisms is becoming a limiting factor in the design of the electronic device.

In addition, many of today's electronic devices are being used as portable devices, such as laptop computers, personal digital assistants (e.g., PDA's), portable telephones (e.g., cellphones), and the like. In such portable devices, consumer preferences are continuously requiring the size and/or weight of the electronic device to be decreased. Thus, the removal of the heat from the electronic device with a smaller and/or lighter cooling mechanism is also becoming a limiting factor in the design of the electronic device.

Another potential design constraint in the removal of heat for electronic devices is the sound generated by the cooling mechanism. Accordingly, not only does the cooling mechanism of a portable electronic device need to be small and efficient, it must also generate a minimal amount of sound.

Thus, there is a continuing need for improvement in the cooling mechanisms for electronic devices. More particularly, and there is a continuing need for cooling mechanisms that effectively remove heat from electronic devices, with a minimal amount of sound and while occupying a minimal amount of space within the device.

SUMMARY OF THE INVENTION

A cooling mechanism having a heat sink, a first conduction device, and a convection device is provided. The first conduction device conducts heat from a heat source to the heat sink. The convection device has a first side, a second side, and a peripheral dimension. The heat sink is disposed about the peripheral dimension of the convection device. The convection device draws in air through the first and second sides and forces the air radially outward across the heat sink.

A cooling mechanism is also provided wherein the cooling mechanism has a ratio of heat removal in watts to volume in cubic centimeters from about 1:1 to about 3:11 at a sound level of between about 20 to 40 decibels.

A cooling mechanism for cooling a heat-generating member of an electronic device is also provided. The cooling mechanism has a heat sink, a first conduction device, and a convection device. The first conduction device conducts heat from the heat-generating member to the heat sink. The convection device has a first side, a second side, and a peripheral dimension. The heat sink is disposed about more than ninety degrees of the peripheral dimension. The convection device draws in air along an axis defined between the first and second sides and forces the air out in a direction normal to the axis across said heat sink. The cooling mechanism has a ratio of heat removal in watts to volume in cubic centimeters from about 1:1 to about 3:11 at a sound level of between about 20 and 40 decibels.

Still another embodiment includes a portable electronic device with an improved cooling mechanism, which uses a fan-heat sink and in some embodiments a thermal hinge. In the fan-heat sink structure, the air inlets are near the axis of the fan motor and the air outlets are on the adjacent vertical walls of the fan housing. Air is coming in parallel to and exiting perpendicular to the axis of the fan motor. This fan structure increases the cooling mechanism's ability to move air with a reduced acoustic sound.

The above-described and other features and advantages of the present disclosure will be appreciated and understood by those skilled in the art from the following detailed description, drawings, and appended claims.

DETAILED DESCRIPTION

Figure 1:
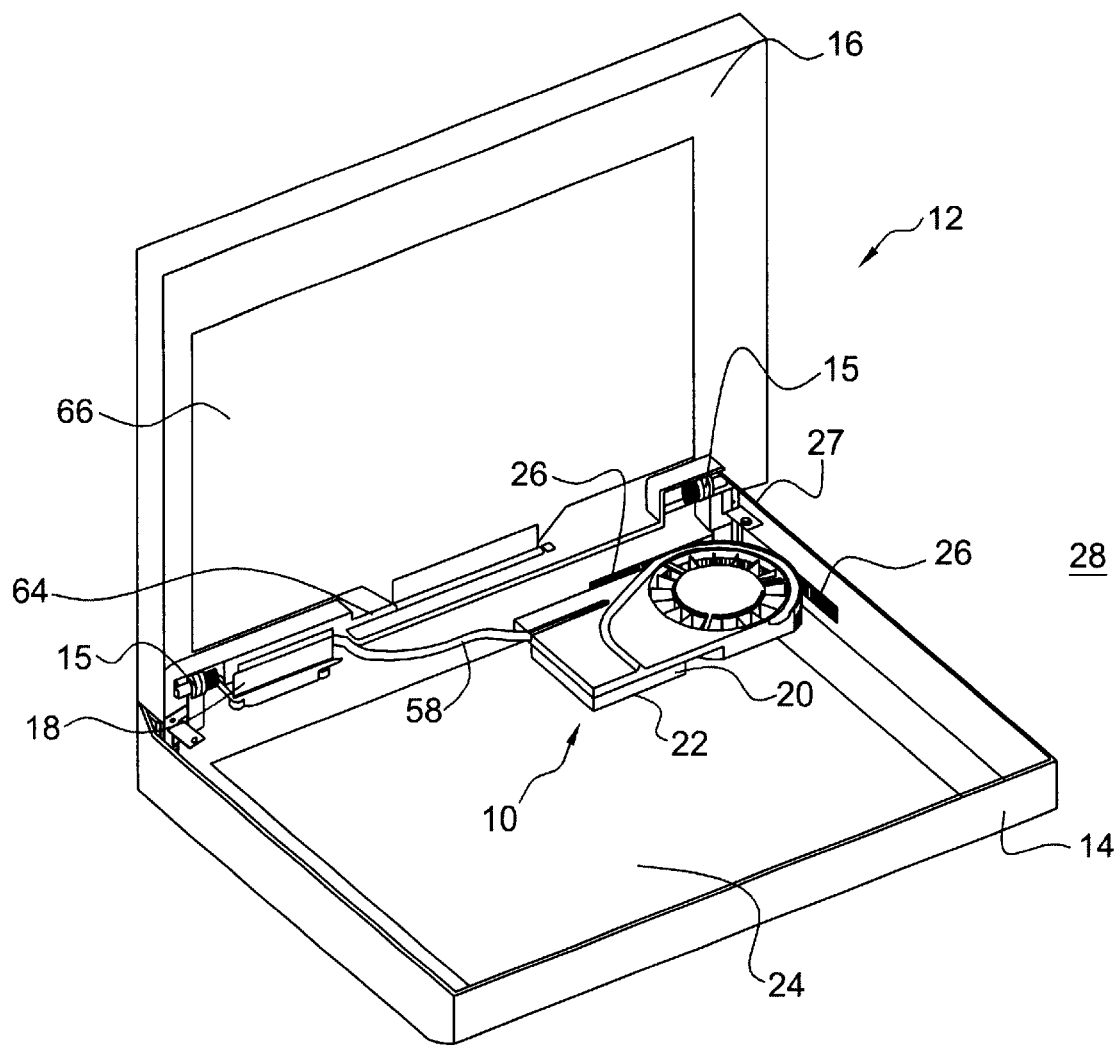
FIG. 1 is a top perspective view of a portable electronic device having a first exemplary embodiment of a cooling mechanism.

Referring now to the figures and in particular to FIG. 1, an exemplary embodiment of a cooling mechanism 10 is illustrated with reference to an electronic device 12, such as a laptop computer.

Electronic device 12 comprises a bottom cavity 14 connected to a top portion 16 by one or more mechanical hinges 15. Electronic device 12 also comprises a heat-generating member 20. For example, heat-generating member 20 can be a semiconductor chip 22 mounted on a printed circuit board (PCB) 24. Of course, it is contemplated that heat-generating member 20 can be a heat-generating component other than chip 22.

Electronic device 12 also includes one or more vent apertures 26 defined in bottom cavity 14. Vent apertures 26 are configured to place bottom cavity 14 in fluid communication with an exterior 28 of electronic device 12. In the illustrated embodiment, vent apertures 26 are disposed along adjoining edges 27 of electronic device 12 and cooling mechanism 10 is positioned proximate these adjoining edges. For purposes of clarity, the remaining components of electronic device 12 have been omitted.

Figure 2:
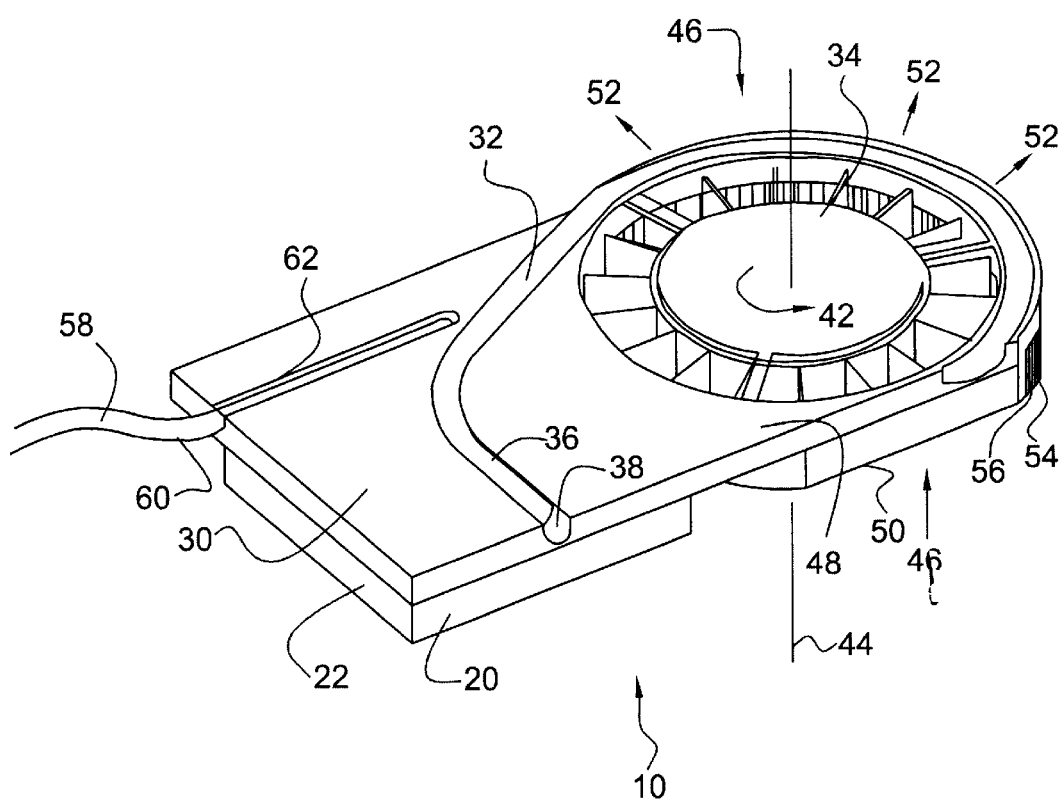
FIG. 2 is a perspective view of the cooling mechanism of FIG. 1.

Cooling mechanism 10 is best understood with simultaneous reference to FIGS. 1 and 2. Cooling mechanism 10 comprises a housing 30, a first conduction device 32, and a convection device 34. Housing 30 supports first conduction device 32 and convection device 34.

Housing 30 is in conductive communication with heat-generating member 20 and first conduction device 32 such that at least the conduction device conducts heat from the heat-generating member. In addition, housing 30 can be configured, through the selection of its materials of construction, to conduct heat from heat-generating member 20. For example, housing 30 can be made from heat conducting materials, such as, aluminum, magnesium, copper, silver, heat conducting polymers, and the like.

First conduction device 32 can be a first heat pipe 36 disposed in an indentation 38 formed in housing 30. Heat pipes typically consist of a sealed aluminum or copper container whose inner surfaces have a capillary wicking material, which transports heat through an evaporation-condensation cycle. First heat pipe 36 can be secured in indentation 38 by suitable means such as a friction fit between the pipe and the indentation. First heat pipe 36 can also be secured in indentation 38 using a heat paste (not shown) alone or in combination with the above mentioned friction fit. In this manner, heat is conducted away from heat-generating member 20 by first conduction device 32, and in some embodiments by housing 30.

Convection device 34 includes a rotating fan blade 40 driven in a direction 42 about a fan axis 44 by a motor (not shown). It should be recognized that blade 40 is illustrated by way of example only having a counter clockwise direction 42. Of course, it is contemplated that direction 42 of fan blade 40 can be either clockwise or counter clockwise. Convection device 34 is thus configured to cause fan blade 40 to draw air 46 into the convection device along axis 44. For example, air 46 is drawn into convection device 34 at both a first side 48 and a second side 50 of housing 30. Electronic device 12 can include an inlet aperture (not shown) proximate first side 48, second side 50, or both, where the inlet apertures are also configured to place bottom cavity 14 in fluid communication with exterior 28 of electronic device 12. Convection device 34 is further configured to cause fan blade 40 to expel air 52 in a direction normal to axis 44 (e.g., radially outward from axis 44).

Housing 30 also comprises a heat sink 54, which includes a plurality of cooling vanes 56. Cooling vanes 56 are positioned between fan blade 40 and vent apertures 26. Moreover, cooling vanes 56 are in fluid communication with fan blade 40 and vent apertures 26. Accordingly, convection device 34 is configured to create a convective flow of air across vanes 56 and out of bottom cavity 14 through vent apertures 26. Heat sink 54 is dimensioned to span more than about eighty (80) degrees of the periphery of convection device 34. For example, heat sink 54 can be dimensioned to span up to about two hundred (200) degrees of the periphery of convection device 34. Hence, the span is preferably in a range between about 80 to 200 degrees, more preferably between about 160 to 180 degrees.

Heat from heat-generating member 20 is conducted to heat sink 54 by first conduction device 32 and, in some embodiments, by housing 30. In order to remove this heat from heat sink 54, convection device 34 draws air 46 in from within bottom cavity 14 and/or through the inlet apertures, forces this air across the heat sink, and out of the bottom cavity through vent apertures 26.

Cooling mechanism 10 combines housing 30, heat sink 54 and convection device 34 in a unitary element that provides an efficient means of removing heat from heat-generating member 20, while occupying a minimal amount of space within electronic device 12.

Electronic device 12 is described, by way of example only, as having a heat-generating member 20 that can generate up to about 60 watts of heat. Of course, heat-generating members that generate more or less than 60 watts of heat are contemplated. In order to remove the 60 watts heat load, convection device 34 generates between about 2 to 8 cubic feet per minute (CFM) of fluid flow across vanes 56 and vent apertures 26 at a sound level between about 20 to 40 decibels (dBa) as measured at 1 meter away from the fan housing with between about 30 to 35 dBa being preferred. Increases in the flow of fluid generated by convection device 34 are of course possible, but would normally generate a commensurate increase in sound levels.

For example, cooling mechanism 10 can remove the 60 watt heat load at a sound level of between about 30 to 35 dBa when it is dimensioned to have a volume in a range between about 60 to 200 cubic centimeters (cc), and more preferably about 70 cc. Thus, cooling mechanism 10 can be defined by its ratio of heat removal (in watts) to volume (in cubic centimeters). In the illustrated embodiment, cooling mechanism 10 has a ratio from about 1:1 to about 3:10, and more preferably about 6:7.

In contrast to cooling mechanism 10, prior mechanisms required about 300 cc of volume to remove the same 60 watt heat load at the same sound level of between about 30 to 35 dBa. In these prior systems, a maximum heat removal to volume ratio of about 1:5 was provided. Thus, cooling mechanism 10 provides a more compact means for removing the same heat load at the same sound level as compared to prior devices.

In an alternate exemplary embodiment also illustrated in FIGS. 1 and 2, cooling mechanism 10 further comprises a second conduction device 58. Second conduction device 58 can be a second heat pipe 60 disposed in a second indentation 62 formed in housing 30. Again, second heat pipe 60 can be secured in second indentation 62 by suitable means such as a friction fit and/or heat paste. In this manner, at least a portion of the heat from heat-generating member 20 is conducted by second conduction device 58 away from the heat-generating member.

In this embodiment, cooling mechanism 10 further comprises a thermal hinge 18. Thermal hinge 18 can be configured as described in commonly owned and assigned U.S. Pat. No. 6,078,499, the contents of which are incorporated in their entirety herein by reference thereto. Second heat pipe 60 is configured to transfer at least a portion of the heat from heat-generating member 20 to thermal hinge 18. Thermal hinge 18 is in conductive communication with a third heat pipe 64 and a heat spreader plate 66 disposed in upper portion 16 of electronic device 12. The amount of heat dissipated by cooling mechanism 10 is further increased by about 9 to 15 watts, depending on the size and configuration of spreader plate 66.

Figure 3:
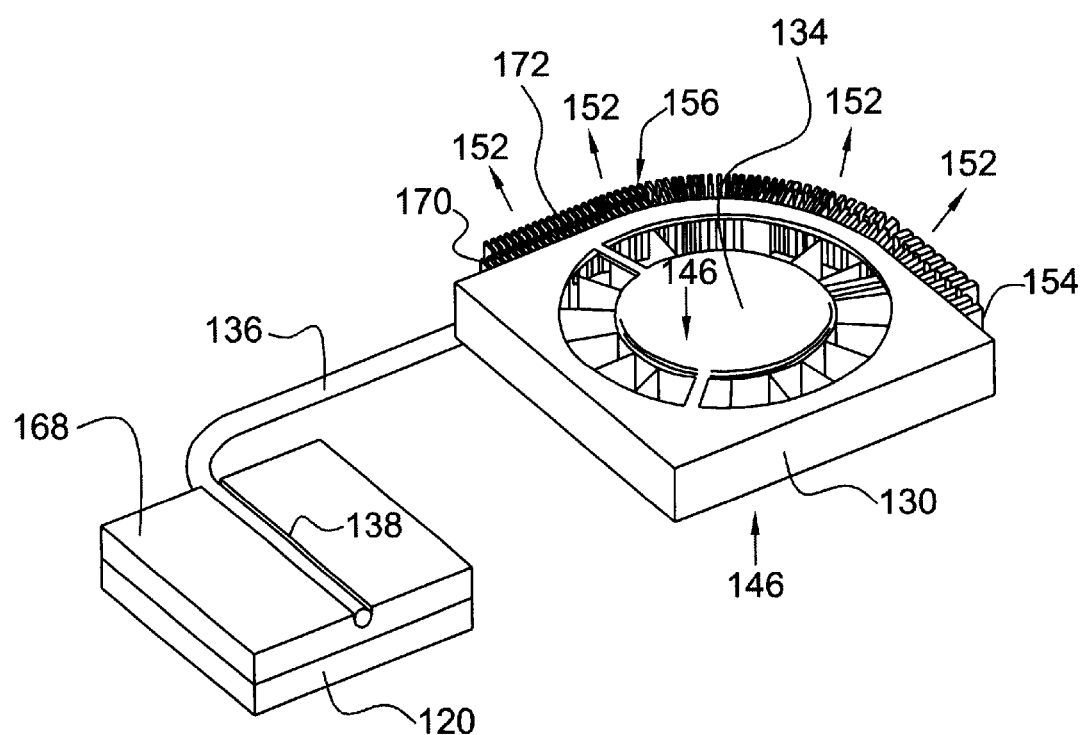
FIGS. 3 and 4 illustrate alternate exemplary embodiments of a cooling mechanism.
Figure 4:
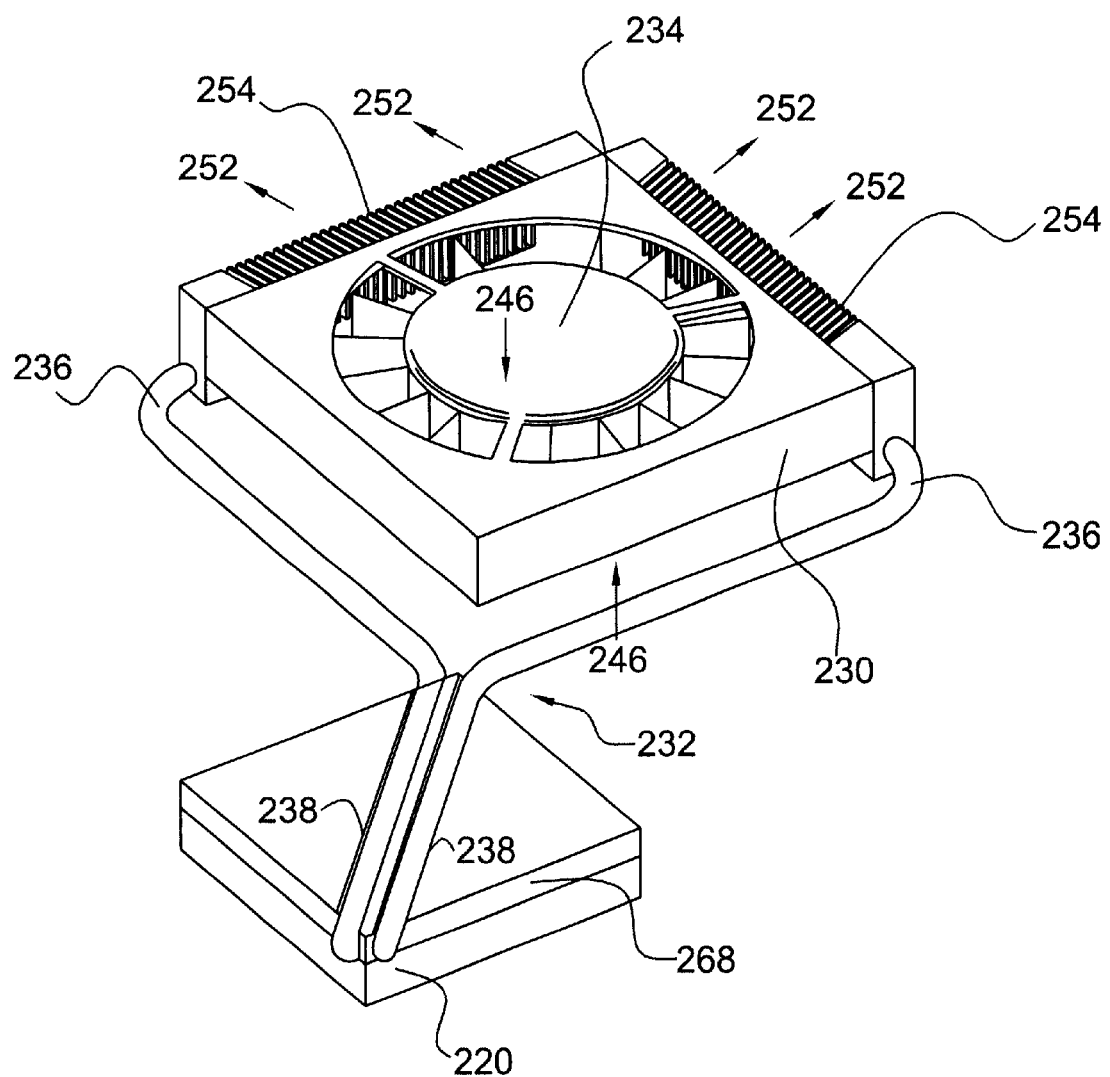

FIGS. 3 and 4 illustrate alternate exemplary embodiments of a cooling mechanism. Here, component parts performing similar or analogous functions are labeled in multiples of one hundred.

A first alternate exemplary embodiment of cooling mechanism 110 is illustrated in FIG. 3. Cooling mechanism 110 comprises a housing 130, a first conduction device 132, and a convection device 134.

In this embodiment, conduction device 132 comprises a conduction plate 168 and a heat pipe 136. Conduction plate 168 is in conductive communication with heat-generating member 120 and heat pipe 136 is in conductive communication with the conduction plate. Heat pipe 136 can be secured in an indentation 138 formed in conduction plate 168 by suitable means such as a friction fit between the pipe and the indentation, a heat paste (not shown), or a combination thereof In this manner, heat from heat-generating member 120 is conducted by first conduction device 132 (e.g., conduction plate 168 and heat pipe 136) to a heat sink 154, which is in fluid communication with convection device 134.

In contrast to the embodiment of FIGS. 1 and 2, heat pipe 136 is not embedded into housing 130. Further, heat sink 154 is separate from housing 130. This allows convection device 134 to be easily replaced in case of a failure of the fan motor, without requiring replacement of heat sink 154 or heat pipe 136.

Heat sink 154 is dimensioned to span more than about eighty (80) degrees of the periphery of convection device 134. For example, heat sink 154 can be dimensioned to span up to about two hundred (200) degrees of the periphery of convection device 134.

In the illustrated embodiment, heat sink 154 includes a plurality of cooling vanes 156 and the heat sink comprises a first section 170 and a second section 172. Heat pipe 136 is disposed between and in conductive communication with these two sections 170, 172. During assembly, first section 170 is removably secured to housing 130 by suitable means (not shown), such as a bolt, a screw, a releasable clip, and the like. Further, heat pipe 136 is disposed between sections 170, 172, which are secured to one another by either removable or permanent connecting means (also not shown).

Again, convection device 134 draws air 146 into the convection device parallel to the axis of the device, and expels air 152 radially from the convection device to create the desired convective flow of air across vanes 156.

The separation of conduction device 132 and heat sink 154 from housing 130 provides flexibility in the implementation of cooling mechanism 110. For example, the location of heat-generating member 120 is not limited to being adjacent to cooling mechanism 110. In addition and in the event that electronic device comprises more than one heat-generating member 20, heat from each of these members can be conducted to heat sink 154 by way of a conduction device 132 (e.g., conduction plate 168 and heat pipe 136) for each of the heat-generating members.

However, this flexibility can reduce the efficiency of cooling mechanism 110 by about ten percent (10%). For example, in order to remove a heat load of about 60 watts from heat-generating member 120 where convection device 134 generates between about 2 to 8 CFM of fluid flow across vanes 156 at a sound level between about 20 to 40 dBa, cooling mechanism 110 is dimensioned to have a volume between about 65 to 220 cc, and more preferably about 80 cc. Here, cooling mechanism 110 has a ratio from about 12:13 to about 3:11, and more preferably about 3:4. Again, these ratios represent improvements over prior cooling mechanisms, while providing increased flexibility in the implementation of cooling mechanism 110 in the electronic device.

Another alternate exemplary embodiment of a cooling mechanism 210 is illustrated in FIG. 4. Again, cooling mechanism 210 comprises a housing 230, a first conduction device 232, and a convection device 234.

Conduction device 232 comprises a conduction plate 268 and a pair of heat pipes 236. Conduction plate 268 is in conductive communication with heat-generating member 220 and heat pipes 236 are in conductive communication with the conduction plate. Heat pipes 236 can be secured in indentation 238 formed in conduction plate 268 by suitable means such as a friction fit between the pipe and the indentation, a heat paste (not shown), or a combination thereof. In this manner, heat from heat-generating member 220 is conducted by first conduction device 232 (e.g., conduction plate 268 and heat pipes 236) to a pair of heat sinks 254, which are in fluid communication with convection device 234.

Heat pipes 236 are not embedded into housing 230. Rather, each heat pipe 236 is disposed in conductive communication with heat sinks 254 such that each heat pipe 236 conducts heat to one of the heat sinks 254. Further, heat sink 254 is separate from housing 230, wherein each heat sink 254 is removably secured to housing 230 by suitable means (not shown), such as a bolt, a screw, a releasable clip, and the like. This configuration again allows convection device 234 to be easily replaced in the event of a failure of the fan motor, without requiring replacement of heat sinks 254 or heat pipes 236.

Each heat sink is dimensioned to span about eighty (80) degrees of the periphery of convection device 234 and, thus, more than 90 degrees of the convection device's periphery comprises the heat sink. For example, the pair of heat sinks 254 can be dimensioned to span up to about two hundred (200) degrees of the periphery of convection device 234.

Convection device 234 draws in air 246 parallel to the axis of rotation of the convection device, and expels air 252 radially (i.e., normal to the axis of rotation of the convection device) to create the desired convective flow of air across heat sinks 254.

The inclusion of a pair of heat pipes 236 and a pair of heat sinks 254 can mitigate a portion of the efficiency loss incurred by separating conduction device 232 and heat sink 254 from housing 230. For example, cooling mechanism 210 is only about 5% less efficient than the embodiment of FIGS. 1 and 2 at removing the 60 watt heat load at a sound level of between about 20 to 40 dBa. Thus, cooling mechanism 210 has a volume between about 63 to 210 cc, and more preferably about 74 cc. Here, cooling mechanism 210 has a ratio from about 20:21 to about 6:21, and more preferably about 30:37.

Again, these ratios represent improvements over prior cooling mechanisms, while providing increased flexibility in the implementation of cooling mechanism 210 in the electronic device.

It should be recognized that the exemplary embodiments of FIGS. 3 and 4 are illustrated, for purposes of clarity only, without the additional thermal hinge and second conduction device of FIGS. 1 and 2. Of course, it is contemplated for the exemplary embodiments of FIGS. 3 and 4 to include such a combination.

It should also be recognized that the cooling mechanism of the present invention is described herein by way of example only has being included in a portable electronic device, such as a laptop computer. Of course, it is contemplated for the cooling mechanism of the present disclosure to find use with any electronic device, such as, but not limited to, desktop computers, televisions, computer monitors, digital video disc players, and the like.

The present invention provides an improved cooling mechanism for electronic devices. The mechanism includes a fan-heat sink and, can also include a thermal hinge. The fan has dual inlets and a radial outlet that spans more than 80 degrees of the periphery of the fan. The heat sink also spans more than 80 degrees of the periphery of the fan and is connected to the heat-generating semiconductor chip through one or more heat pipes. The fan and the heat sinks can be separate entities. An efficient thermal contact between the heat pipes and the heat-generating semiconductor chip package are, provided by way of connection blocks and/or clamping mechanisms as is known in the art.

The terms "first", "second", and "third" and the like may be used herein to modify various elements. These modifiers do not imply a spatial, sequential, or hierarchical order to the modified elements unless specifically stated.

While the invention has been described with reference to one or more exemplary embodiments, those skilled in the art will understand that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A cooling mechanism comprising:
   a heat sink;
   a first conduction device configured to conduct heat from a heat source to said heat sink; and
   a convection device configured force air across said heat sink, wherein the cooling mechanism has a ratio of heat removal in watts to volume in cubic centimeters in a range from about 1:1 to 3:11 at a sound level in a range of between about 20 to 40 decibels, wherein said convection device has a first side, a second side, a peripheral dimension, said heat sink being disposed about said peripheral dimension of said convection device, and said convection device being configured to draw in air through said first and second sides and to force said air radially outward across said heat sink, and wherein said heat sink is dimensioned to span in a range of about one hundred and sixty to two hundred degrees of said peripheral dimension.

2. A cooling mechanism comprising:
   a heat sink;
   a first conduction device configured to conduct heat from a heat source to said heat sink;
   a convection device configured force air across said heat sink, wherein the cooling mechanism has a ratio of heat removal in watts to volume in cubic centimeters in a range from about 1:1 to 3:11 at a sound level in a range of between about 20 to 40 decibels;
   a thermal hinge; and
   a second conduction device in conductive communication with said heat source and said thermal hinge, said second conduction device being configured to conduct a portion of said heat from said heat source to said thermal hinge.

3. A cooling mechanism for cooling a heat-generating member of an electronic device, the cooling mechanism comprising:
   a heat sink;
   a first conduction device configured to conduct heat from the heat-generating member to said heat sink; and
   a convection device having a first side, a second side, and a peripheral dimension, said heat sink disposed about more than ninety degrees of said peripheral dimension, and said convection device being configured to draw in air parallel to an axis defined between said first and second sides, said air being drawn in through both said first and second sides, and said air being forced out of said convection device in a direction normal to said axis and across said heat sink, wherein the cooling mechanism has a ratio of heat removal in watts to volume in cubic centimeters in a range from between about 1:1 to 3:11 at a sound level in a range from between about 20 to 40 decibels.

4. A cooling mechanism comprising:
   a heat sink;
   a first conduction device configured to conduct heat from a heat source to said heat sink;
   a convection device having a first side, a second side, and a peripheral dimension, said heat sink disposed about said peripheral dimension, said convection device being configured to draw in air through said first and second sides and to force said air radially outward across said heat sink;
   a thermal hinge; and
   a second conduction device in conductive communication with said heat source and said thermal hinge, said second conduction device being configured to conduct a portion of said heat from said heat source to said thermal hinge.

5. The cooling mechanism as in claim 4, wherein said first conduction device comprises a first heat pipe and a conduction plate, said conducting plate conducting said heat from said heat source to said first heat pipe, and said first heat pipe conducting said heat from said conducting plate to said heat sink.

6. The cooling mechanism as in claim 5, wherein said first conduction device comprises a first heat pipe, a second heat pipe, and a conduction plate, and said heat sink comprises a first heat sink and a second heat sink, wherein said conducting plate conducts said heat from said heat source to said first and second heat pipes, said first heat pipe conducts said heat from said conducting plate to said first heat sink, and said second heat pipe conducts said heat from said conducting plate to said second heat sink.

7. A cooling mechanism comprising:
   a heat sink;
   a first conduction device configured to conduct heat from a heat source to said heat sink; and
   a convection device having a first side, a second side, and a peripheral dimension, said heat sink disposed about said peripheral dimension, said convection device being configured to draw in air through said first and second sides and to force said air radially outward across said heat sink, said first conduction device being a first heat pipe, and wherein said heat sink comprises a first section and a second section, said first heat pipe is disposed between and in conductive communication with said first and second sections.

8. The cooling mechanism as in claim 7, further comprising a housing supporting said convection device and said heat sink.

9. The cooling mechanism as in claim 8, wherein said convection device, said heat sink, and said housing are a unitary element.

10. The cooling mechanism as in claim 9, wherein said housing is configured to conduct said heat from said heat source to said heat sink.

11. The cooling mechanism as in claim 8, wherein said heat sink is removably connected to said housing.

12. A cooling mechanism comprising:
    a heat sink;
    a first conduction device configured to conduct heat from a heat source to said heat sink; and
    a convection device having a first side, a second side, and a peripheral dimension, said heat sink disposed about said peripheral dimension, said convection device being configured to draw in air through said first and second sides and to force said air radially outward across said heat sink, wherein said heat sink is dimensioned to span between about eighty to two hundred degrees of said peripheral dimension.

13. The cooling mechanism as in claim 12, wherein said heat sink is dimensioned to span between about one hundred and sixty to two hundred degrees of said peripheral dimension.

14. The cooling mechanism as in claim 12, wherein said convection device forces said air across said heat sink at a range of between about 2 to 8 cubic feet per minute and at a sound level of between about 20 to 40 decibels.

15. The cooling mechanism as in claim 12, wherein said convection device comprises an axis defined through said first and second sides, said convection device drawing said air in parallel to said axis via said first and second sides, and said convection device forcing said air radially outward in a direction normal to said axis.

16. A cooling mechanism comprising:
   a heat sink;
   a first conduction device configured to conduct heat from a heat source to said heat sink; and
   a convection device configured force air across said heat sink, wherein the cooling mechanism has a ratio of heat removal in watts to volume in cubic centimeters in a range from about 1:1 to 3:11 at a sound level in a range of between about 20 to 40 decibels.

17. The cooling mechanism as in claim 16, wherein said ratio is from between about 3:4 to 6:7.

18. The cooling mechanism as in claim 17, wherein said sound level is between about 30 to 35 decibels.

19. The cooling mechanism as in claim 16, wherein said convection device has a first side, a second side, a peripheral dimension, said heat sink being disposed about said peripheral dimension of said convection device, and said convection device being configured to draw in air through said first and second sides and to force said air radially outward across said heat sink.

20. The cooling mechanism as in claim 19, wherein said heat sink is dimensioned to span in a range of about eighty to two hundred degrees of said peripheral dimension.

* * * * *